(12) United States Patent
Yasugi (10) Patent No.: US 12,283,837 B2
(45) Date of Patent: Apr. 22, 2025

(54) SECONDARY BATTERY MANAGEMENT SYSTEM, SECONDARY BATTERY MANAGEMENT METHOD AND SECONDARY BATTERY MANAGEMENT PROGRAM FOR SAID SECONDARY BATTERY MANAGEMENT SYSTEM, AND SECONDARY BATTERY SYSTEM

(71) Applicant: Mitsubishi Power, Ltd., Yokohama (JP)

(72) Inventor: Akira Yasugi, Kanagawa (JP)

(73) Assignee: MITSUBISHI POWER, LTD., Yokohama (JP)

(\*) Notice: Subject to any disclaimer, the term of this patent is extended or adjusted under 35 U.S.C. 154(b) by 1009 days.

(21) Appl. No.: 17/285,579

(22) PCT Filed: Oct. 8, 2019

(86) PCT No.: PCT/JP2019/039585
§ 371 (c)(1),
(2) Date: Jan. 18, 2022

(87) PCT Pub. No.: WO2020/080176
PCT Pub. Date: Apr. 23, 2020

(65) Prior Publication Data
US 2022/0140636 A1   May 5, 2022

(30) Foreign Application Priority Data
Oct. 19, 2018 (JP) .................. 2018-197681

(51) Int. Cl.
| | |
|---|---|
| *H02J 7/00* | (2006.01) |
| *G01R 31/3835* | (2019.01) |
| *G01R 31/392* | (2019.01) |
| *H01M 10/46* | (2006.01) |
| *H01M 10/48* | (2006.01) |

(Continued)

(52) U.S. Cl.
CPC ...... *H02J 7/00712* (2020.01); *G01R 31/3835* (2019.01); *G01R 31/392* (2019.01);
(Continued)

(58) Field of Classification Search
CPC .. H02J 7/00712; H02J 7/00302; H02J 7/0048; H02J 7/005; H01M 10/425;
(Continued)

(56) References Cited

U.S. PATENT DOCUMENTS

| | | | |
|---|---|---|---|
| 9,086,463 B2\* | 7/2015 | Tamura | G01R 31/392 |
| 2007/0075678 A1\* | 4/2007 | Ng | H02J 7/007192 |
| | | | 320/106 |

(Continued)

FOREIGN PATENT DOCUMENTS

| | | |
|---|---|---|
| EP | 3 790 153 A1 | 3/2021 |
| JP | 2001-157369 A | 6/2001 |

(Continued)

OTHER PUBLICATIONS

International Search Report dated Dec. 3, 2019, issued in counterpart application No. PCT/JP2019/039585, with English translation. (3 pages).

(Continued)

*Primary Examiner* — Edward Tso
*Assistant Examiner* — Aaron Piggush
(74) *Attorney, Agent, or Firm* — WHDA, LLP (57) ABSTRACT

A secondary battery management system, a secondary battery management method and a secondary battery management program for the secondary battery management system, and a secondary battery system with which a target state of charge of a secondary battery can be appropriately set by taking into consideration a degradation degree. A secondary battery management system includes a setting unit configured to set a temporary target state of charge of a secondary (Continued)

battery based on a target power amount, an estimating unit configured to estimate a degradation degree of the secondary battery based on an amount of change in a state of charge of the secondary battery over a predetermined constant-current charging period of the secondary battery, and a calculating unit configured to calculate a target state of charge of the secondary battery by correcting the temporary target state of charge in accordance with the degradation degree.

18 Claims, 7 Drawing Sheets

(51) Int. Cl.
*H01M 10/42* (2006.01)
*H01M 10/44* (2006.01)

(52) U.S. Cl.
CPC ........... *H01M 10/46* (2013.01); *H01M 10/48* (2013.01); *H02J 7/0048* (2020.01); *H02J 7/005* (2020.01); *H01M 10/425* (2013.01); *H01M 2010/4271* (2013.01); *H01M 10/441* (2013.01); *H01M 10/482* (2013.01); *H02J 7/00302* (2020.01)

(58) Field of Classification Search
CPC .... H01M 10/441; H01M 10/46; H01M 10/48; H01M 10/482; H01M 2010/427; G01R 31/392; G01R 31/3835
USPC ................................. 320/132, 134, 136, 157
See application file for complete search history.

(56) References Cited

U.S. PATENT DOCUMENTS

| 2013/0166234 | A1* | 6/2013 | Chou .................. G01R 31/392 |
| | | | 702/63 |
| 2017/0371000 | A1* | 12/2017 | Fukushima ........... H02J 7/0013 |
| 2019/0202299 | A1* | 7/2019 | Oh ...................... H01M 10/425 |
| 2021/0066945 | A1 | 3/2021 | Jung et al. |

FOREIGN PATENT DOCUMENTS

| JP | 2002-305841 A | 10/2002 |
| JP | 2009-159730 A | 7/2009 |
| JP | 2010-75024 A | 4/2010 |
| JP | 2015-61426 A | 3/2015 |
| JP | 2016-195495 A | 11/2016 |
| WO | 2016/059869 A1 | 4/2016 |

OTHER PUBLICATIONS

Written Opinion dated Dec. 3, 2019, issued in counterpart application No. PCT/JP2019/039585, with English translation. (9 pages).
Office Action dated Nov. 22, 2022, issued in counterpart JP Application No. 2018-197681, with English translation. (8 pages).
Office Action dated Nov. 22, 2022, issued in counterpart AU Application No. 2019361447. (5 pages).
Office Action dated Apr. 29, 2022, issued in counterpart GB application No. 2105319.4. (4 pages).
Office Action dated May 31, 2022, issued in counterpart JP application No. 2018-197681, with English translation. (8 pages).

* cited by examiner

SECONDARY BATTERY MANAGEMENT SYSTEM, SECONDARY BATTERY MANAGEMENT METHOD AND SECONDARY BATTERY MANAGEMENT PROGRAM FOR SAID SECONDARY BATTERY MANAGEMENT SYSTEM, AND SECONDARY BATTERY SYSTEM

TECHNICAL FIELD

The present disclosure relates to a secondary battery management system, a secondary battery management method and a secondary battery management program for the secondary battery management system, and a secondary battery system.

BACKGROUND ART

Some power grids connected to a thermal power plant are provided with secondary batteries for grid stabilization. For example, the secondary battery is under charging/discharging control to be within an operation range (an SOC upper limit value and an SOC lower limit value).

For example, Patent Document 1 discloses an estimation of a state of health (SOH), where the SOC is set to be within the upper limit value and the lower limit value based on the SOH.

CITATION LIST

Patent Document

Patent Document 1: JP 2016-195495 A

SUMMARY OF INVENTION

Technical Problem

In many cases, the secondary batteries stand by in a high charge state, so that discharging can be performed when required with a sufficient amount of remaining charge. However, the secondary batteries tend to degrade more easily when maintained at the high charge state for a longer period of time, and thus are not preferably maintained at such the high state of charge for an excessively long period of time.

The present disclosure has been made in view of such a circumstance, and an object is to provide a secondary battery management system, a secondary battery management method and a secondary battery management program of the secondary battery management system, and a secondary battery system with which a target state of charge of a secondary battery can be accurately and appropriately set by taking a degradation degree into consideration.

Solution to Problem

A first aspect of the present disclosure is a secondary battery management system including a setting unit configured to set a temporary target state of charge of a secondary battery based on a target power amount, an estimating unit configured to estimate a degradation degree of the secondary battery based on an amount of change in a state of charge of the secondary battery over a predetermined constant-current charging period of the secondary battery, and a calculating unit configured to calculate a target state of charge of the secondary battery by correcting the temporary target state of charge in accordance with the degradation degree.

With the configuration described above, the degradation degree of the secondary battery in the present state is estimated each time based on the amount of change in the state of charge of the secondary battery over the constant-current charging period that is performed in a charging period, whereby the degradation degree of the secondary battery can be more accurately calculated. The temporary target state of charge set based on the target power amount is corrected in accordance with the degradation degree to determine the target state of charge of the secondary battery. Thus, the power can be more reliably stored in the secondary battery with respect to the target power amount, by taking the shortage of the charging capacity due to the degradation into consideration.

The target state of charge of the secondary battery can be appropriately set by taking the degradation degree in the present state into consideration, and thus the secondary battery is prevented from being maintained in an excessively high charge state, whereby the reduction of battery life can be suppressed.

In the secondary battery management system described above, the estimating unit may estimate the degradation degree of the secondary battery based on a ratio between a state of charge change rate that is an amount of change in a state of charge of the secondary battery in a present state over the constant-current charging period and an initial state of charge change rate of a change in the secondary battery in an initial state over the constant-current charging period.

With the configuration described above, the degradation degree in the present state is estimated in accordance with a ratio between the state of charge change rate in a present state and the initial state of charge change rate of the secondary battery, and thus the degradation degree can be easily estimated. Here, the initial state of charge change rate of the secondary battery is an amount of change in the state of charge of the secondary battery over the predetermined constant-current charging period, which is checked when the secondary battery is in the initial state (state before the degradation, such as during test operation adjustment, for example).

In the secondary battery management system described above, the constant-current charging period may be set based on a sampling period related to measurement of the state of charge of the secondary battery, such that a measurement error is smaller than an upper limit value set in advance.

With the configuration described above, with setting the constant-current charging period based on the sampling period, the constant-current charging period can be set with the measurement error being smaller than an upper limit value set in advance, whereby the degradation degree of the secondary battery can be more accurately estimated. An excessively short constant-current charging period for estimating the degradation degree relative to the sampling period related to the measurement of the state of charge might lead to a large measurement error.

In the secondary battery management system described above, the calculating unit may issue a warning notification when the target state of charge is outside a state of charge allowable range set in advance.

With the configuration described above, when the secondary battery is charged using a target state of charge outside the state of charge allowable range, safe operation may not be possible. Thus, the warning notification is issued for improving safety.

The secondary battery management system described above may further include a charging control unit configured to start constant-current charging of the secondary battery when the state of charge of the secondary battery reaches a reference state of charge.

With the configuration described above, the constant-current charging starts when the state of charge reaches the reference state of charge, and thus the state of charge of the secondary battery at which the constant-current charging starts can be uniformly set. Thus, an appropriate setting can be achieved for performing under the same condition of the state of the secondary battery in the constant-current charging period for estimating the degradation degree, whereby the degradation degree can be more accurately estimated.

A second aspect of the present disclosure is a secondary battery system including, a secondary battery, a charging/discharging device configured to control a charging/discharging amount of current flowing through the secondary battery, and the secondary battery management system described above.

A third aspect of the present disclosure is a secondary battery management method including, setting a temporary target state of charge of a secondary battery based on a target power amount, estimating a degradation degree of the secondary battery based on an amount of change in a state of charge of the secondary battery over a predetermined constant-current charging period of the secondary battery, and calculating a target state of charge of the secondary battery by correcting the temporary target state of charge in accordance with the degradation degree.

A fourth aspect of the present disclosure is a secondary battery management program that causes a computer to execute, setting processing of setting a temporary target state of charge of a secondary battery based on a target power amount, estimation processing of estimating a degradation degree of the secondary battery based on an amount of change in a state of charge of the secondary battery over a predetermined constant-current charging period of the secondary battery, and calculation processing of calculating a target state of charge of the secondary battery by correcting the temporary target state of charge in accordance with the degradation degree.

Advantageous Effects of Invention

The present disclosure provides an effect of enabling a target state of charge of a secondary battery to be appropriately set by taking a degradation degree into consideration.

DESCRIPTION OF EMBODIMENTS

An embodiment of a secondary battery management system, a secondary battery management method and a secondary battery management program of the secondary battery management system, and a secondary battery system according to the present disclosure will be described below with reference to the drawings.

Figure 1:
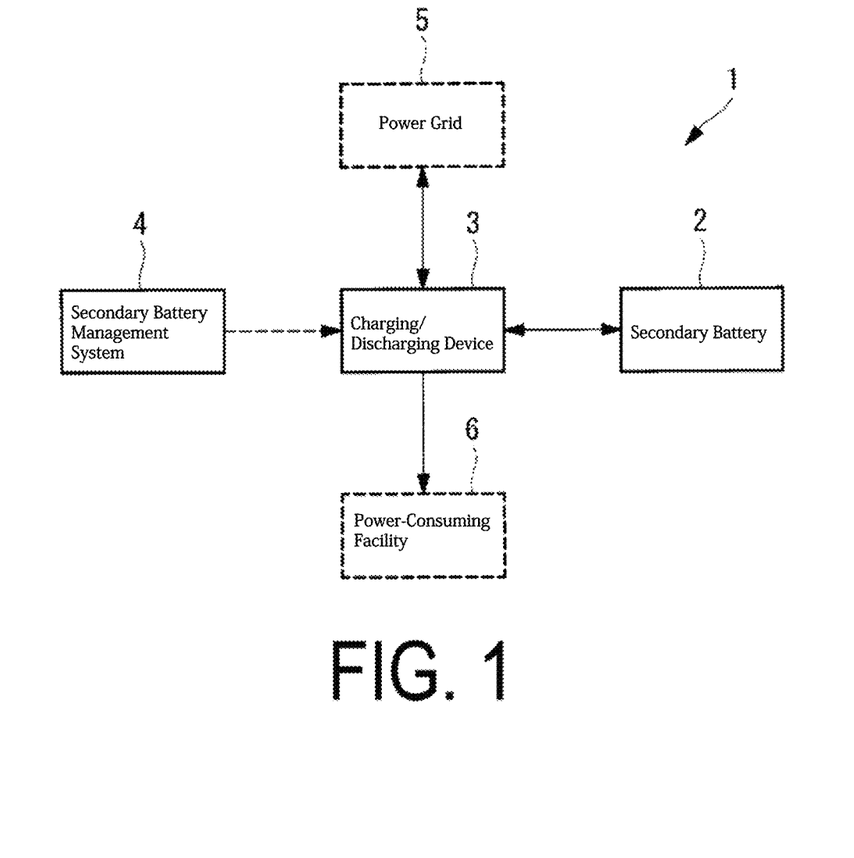
FIG. 1 is a diagram illustrating a schematic configuration of a secondary battery system according to an embodiment of the present disclosure.

FIG. 1 is a diagram illustrating a schematic configuration of a secondary battery system 1 including a secondary battery management system 4 according to an embodiment of the present disclosure. As illustrated in FIG. 1, the secondary battery system 1 according to the present embodiment includes a secondary battery 2, a charging/discharging device 3, and the secondary battery management system 4 as main configurations, and the secondary battery system 1 is connected to a power grid 5 and a power-consuming facility 6.

The secondary battery 2 is a device capable of storing and discharging power. For example, the secondary battery 2 is configured by a plurality of unit secondary batteries combined to achieve desired voltage and capacity. The secondary battery 2 may be configured by a single unit secondary battery. The secondary battery 2 is configured using, for example, a lithium-ion secondary battery, a lead secondary battery, a nickel hydrogen secondary battery, a sodium sulfur battery (NaS), or the like.

The charging/discharging device 3 controls the charging/discharging amount flowing through the secondary battery 2. Specifically, the charging/discharging device 3 performs charging/discharging control on the secondary battery 2 to bring the state of charge of the secondary battery 2 closer to the target state of charge of the secondary battery 2 set in the secondary battery management system 4 described later. A voltmeter that measures the open end voltage of the secondary battery 2 is connected to the charging/discharging device 3.

The charging/discharging device 3 is connected to the power grid 5 and the secondary battery 2, and causes the power to flow. For example, the power grid 5 is a power distribution network that connects a power generation facility and a consumer to each other, and has three-phase alternating current power flowing therein. Thus, when charging the secondary battery 2, the charging/discharging device 3 converts the three-phase alternating current into direct current to make the power flow from the power grid 5 to the secondary battery 2. When discharging the secondary battery 2, the charging/discharging device 3 converts the direct current into three-phase alternating current to make the power flow from the secondary battery 2 to the power-consuming facility 6 or the power grid 5.

The state of charge (SOC) of the secondary battery 2 is a ratio of the remaining charge (the amount of power charged in the secondary battery 2) to the full charge state. Thus, for example, if the remaining charge is 0, the state of charge is 0%, and if the remaining charge is a fully charged state, the state of charge is 100%. The state of charge of the secondary battery 2 is correlated to the open end voltage of the secondary battery 2 (the output voltage in an OCV open state (zero output current)), and may be expressed, for example, as SOC-OCV characteristics. Thus, when a correlation such as the SOC-OCV characteristics is obtained for the characteristics of the secondary battery 2 in advance, the present state of charge of the secondary battery 2 can be estimated from the present open end voltage of the secondary battery 2.

The charging/discharging device 3 charges the secondary battery 2 such that the open end voltage of the secondary battery 2 reaches the open end voltage corresponding to the target state of charge (SOCtemp and SOCt described later). The applicable value is not limited to the open end voltage, as long as the state of charge of the secondary battery 2 can be estimated.

Upon receiving a command from the secondary battery management system 4 to charge the secondary battery 2 to the target state of charge, the charging/discharging device 3 charges the secondary battery 2, where at least a part of the charging time is spent for constant-current charging. The constant-current charging described herein is a charging method in which the secondary battery 2 is charged by being supplied with a predetermined constant voltage set in advance.

The secondary battery management system 4 controls charging/discharging of the secondary battery 2. Specifically, the secondary battery management system 4 controls charging and discharging of the secondary battery 2 by controlling the charging/discharging device 3, and thus manages the charged state of the secondary battery 2. In particular, the secondary battery management system 4 of the present embodiment sets the target state of charge of the secondary battery 2 by taking the degradation degree of the secondary battery 2 into consideration.

When the secondary battery 2 degrades further, the chargeable capacity is lowered. Thus, the power storage amount of the degraded secondary battery 2 charged to a certain state of charge (SOCtemp described later) is smaller than the power storage amount of the secondary battery 2, with no degradation, charged to the same state of charge. This means that unless the influence of the degradation is taken into consideration, the power storage amount of the secondary battery 2 becomes small and the amount of electricity that needs to be discharged might fail to be stored. In view of this, the secondary battery management system 4 sets the target state of charge by taking the degradation degree of the secondary battery 2 into consideration, whereby the amount of energy required can be reliably stored in the secondary battery 2 without being too much or too small.

The secondary battery management system 4, for example, is configured of a central processing unit (CPU), a memory such as a random access memory (RAM), and a computer readable recording medium (which are not illustrated). A sequence of processing for implementing various functions described below is stored on a recording medium or the like in the form of a program, and the various functions described below are implemented by the CPU loading this program into the RAM or the like, and executing information processing and calculation processing. As the program, a program pre-installed in the ROM or another storage media, a program provided in a state of being stored in a computer readable storage medium, a program distributed through wired or wireless communication methods, or the like may also be used. Examples of the computer-readable storage medium include a magnetic disk, a magneto-optical disk, a CD-ROM, a DVD-ROM, and a semiconductor memory.

Figure 2:
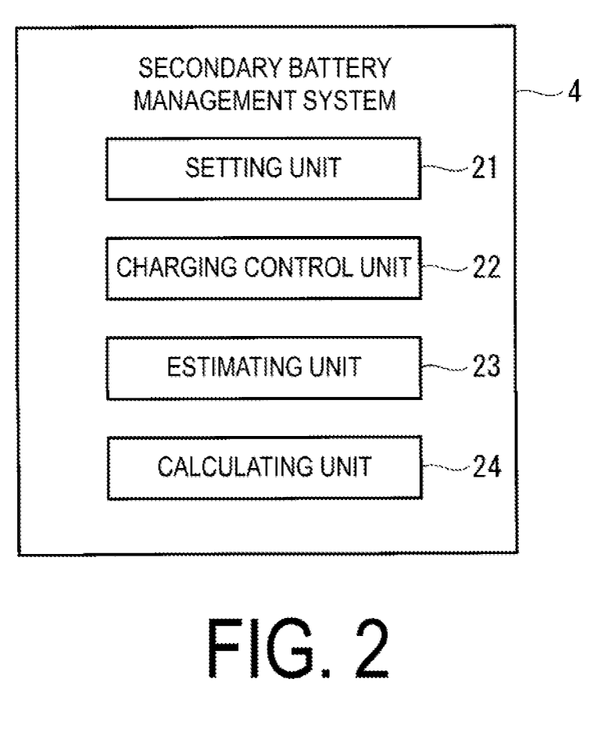
FIG. 2 is a functional block diagram illustrating functions of the secondary battery management system according to an embodiment of the present disclosure.

FIG. 2 is a functional block diagram illustrating functions of the secondary battery management system 4. As illustrated in FIG. 2, the secondary battery management system 4 includes a setting unit 21, a charging control unit 22, an estimating unit 23, and a calculating unit 24.

The setting unit 21 sets a temporary target state of charge (SOCtemp described later) of the secondary battery 2 based on a target power amount supplied from the secondary battery system 1. The target power amount is the amount of power required in a discharge period until the next charge. Thus, the target power amount is stored in the secondary battery 2 while taking the efficiency of the charging/discharging device 3 into consideration, and is extracted as discharge from the secondary battery 2 when required to be used for power demand during the discharge period until the next charge. The target power amount is scheduled based on an operation plan or the like for the discharge period until the next charge (for example, the next day) in the power-consuming facility 6 to which the secondary battery system 1 is applied. For example, when the system is applied to a thermal power plant or the like, the target power amount is an amount of power set for the purpose of suppressing sudden fluctuation occurring during the daytime of the next day, against an overall total power variation schedule of the power-consuming facility 6 in the power grid 5 linked with the thermal power plant. When the system is applied to a factory or the like serving as the power-consuming facility 6, the target power amount is set as power for achieving peak cut in daytime, based on the operation plan for the factory or the like. How the target power amount is set is not limited, as long as the amount is scheduled for the discharge period until the next charge, and the amount of power that needs to be stored can be identified.

The setting unit 21 calculates a temporary target state of charge (SOCtemp described later) for storing the target power amount in the secondary battery 2 based on the target power amount set. The temporary target state of charge is the state of charge of the secondary battery 2 when the target power amount is stored in the secondary battery 2 in the initial state of the secondary battery 2 or in a state with no reduction in the chargeable capacity of the secondary battery 2. For the actual target state of charge (SOCt described below), the calculating unit 24 to be described below corrects the temporary target state of charge based on the degradation degree.

Figure 3:
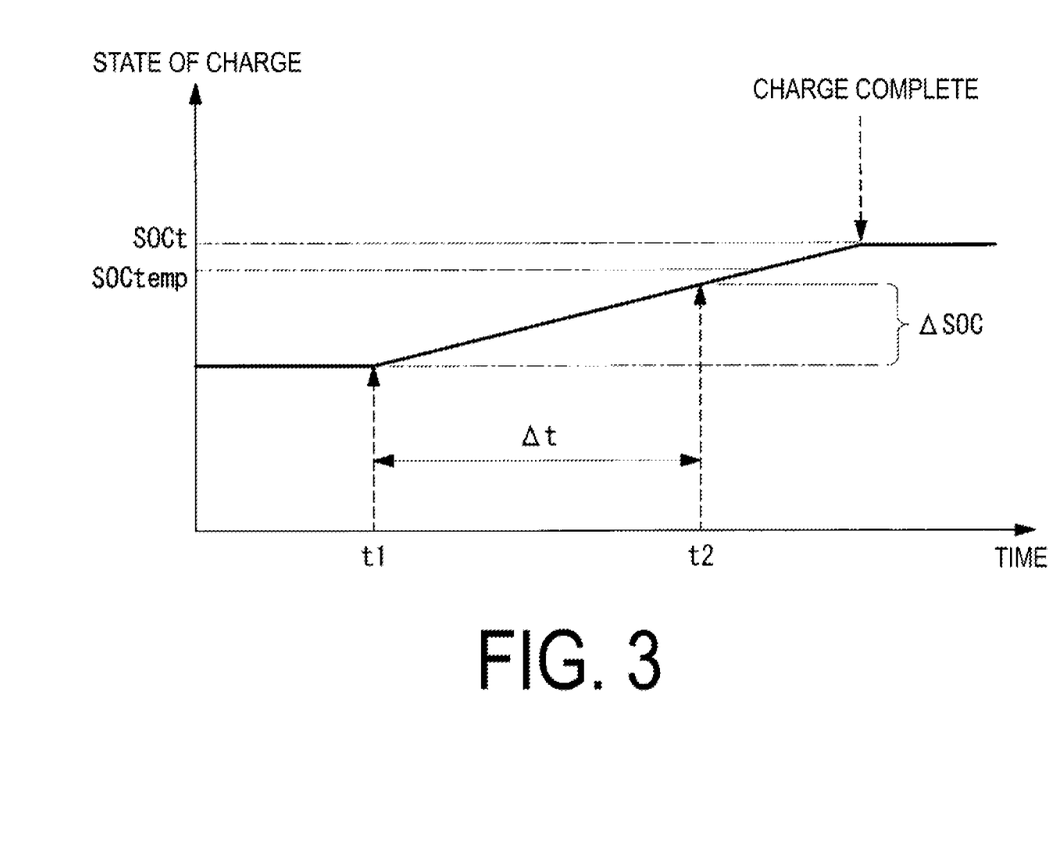
FIG. 3 is a diagram illustrating the charged state over time of a secondary battery in the secondary battery management system according to an embodiment of the present disclosure.

The charging control unit 22 starts the constant-current charging for the secondary battery 2 when the state of charge of the secondary battery 2 reaches a certain predetermined reference state of charge initially set. FIG. 3 is a diagram illustrating the charged state over time of the secondary battery 2 as an example of the present embodiment. FIG. 3 illustrates an example of a case in which the state of charge of the secondary battery 2 is at the reference state of charge at a time point t1. As shown in FIG. 3, the constant-current charging is initiated at the time point t1. The charging control unit 22 outputs a constant-current charging start command to the charging/discharging device 3. In the present embodiment, the charging control unit 22 starts the constant-current charging when the state of charge of the secondary battery 2 is at the certain predetermined reference state of charge initially set. Alternatively, the constant-current charging may start without the state of charge being at the reference state of charge, and even start with the present state of charge for example.

Figure 4:
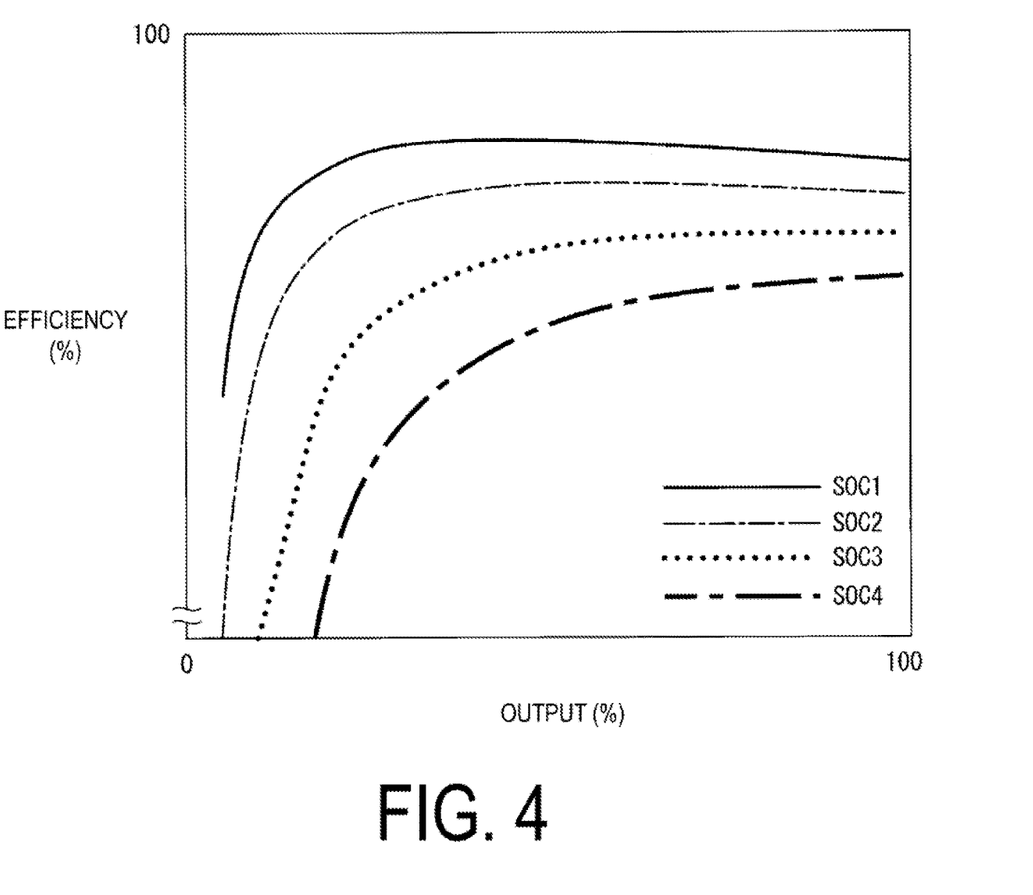
FIG. 4 is a diagram illustrating a relationship between efficiency of a charging/discharging device and the state of charge of the secondary battery in the secondary battery management system according to an embodiment of the present disclosure.

The efficiency of the charging/discharging device 3 varies depending on the state of charge (output voltage) of the secondary battery 2. FIG. 4 is a diagram illustrating the relationship between the efficiency of the charging/discharging device 3 and the state of charge of the secondary battery 2. In FIG. 4, the vertical axis represents the efficiency (%) of the charging/discharging device 3, and the horizontal axis represents the output (%) of the charging/discharging device 3. FIG. 4 illustrates characteristics of each SOC (output voltage based on the state of charge) of the secondary battery 2 as a parameter. The secondary battery 2 has an SOC parameter satisfying the relationship SOC1<SOC2<SOC3<SOC4. Decreased efficiency of the charging/discharging device 3 occurs mainly due to heat loss of a circuit inside the charging/discharging device 3. The efficient output range of the charging/discharging device 3 depends on the SOC of the secondary battery 2, as indicated. Thus, the charging control unit 22 sets in advance the predetermined constant current value for the constant-current charging to increase the efficiency of the charging/discharging device 3 according to the operation status of the secondary battery system 1, and causes the constant-current charging to be executed using this predetermined constant current value.

Specifically, as illustrated in FIG. 4, when the state of charge of the secondary battery 2 is SOC2, the maximum efficiency is achieved with the output of the charging/discharging device 3 being about the half of the rated current. The SOC2 is, for example, 30% SOC in the present embodiment. Thus, when the state of charge of the secondary battery 2 reaches a reference state of charge, the constant-current charging for the secondary battery 2 starts with SOC2 being a reference state of charge. This configuration makes it possible to execute constant-current charging, while the efficiency of the charging/discharging device 3 is improved. In the present embodiment, a charging start condition is managed with the predetermined reference state of charge set to, for example, 30%±5%, so that the state of the secondary battery in the constant-current charging period for estimating the degradation degree can be implemented under the same conditions. When the state of charge of the secondary battery 2 has not reached the reference state of charge before the constant-current charging starts, the constant-current charging may start after the state of charge of the secondary battery 2 has reached the reference state of charge due to the charging or discharging caused by an operation of the secondary battery system 1, or the constant-current charging may start after the state of charge has reached the reference state of charge by controlling the secondary battery 2 to actively perform charging/discharging.

As illustrated in FIG. 4, when the SOC is SOC1, the efficiency of the charging/discharging device 3 tends to be the highest with the output of the charging/discharging device 3 being equal to or lower than the rated current. However, this operation is performed in a state in which the state of charge of the secondary battery 2 is less than 30% (the state close to the operation lower limit value), and this is not preferable in terms of the secondary battery 2 degrading due to overdischarge and equipment capacity for securing the required storage capacity. When the SOC is SOC4, the overall efficiency of the charging/discharging device 3 tends to be low. Further, operation is performed in a state where the state of charge is high (close to the operation upper limit value), and this is not preferable in terms of the risk of the secondary battery 2 degrading due to overcharging.

Figure 5:
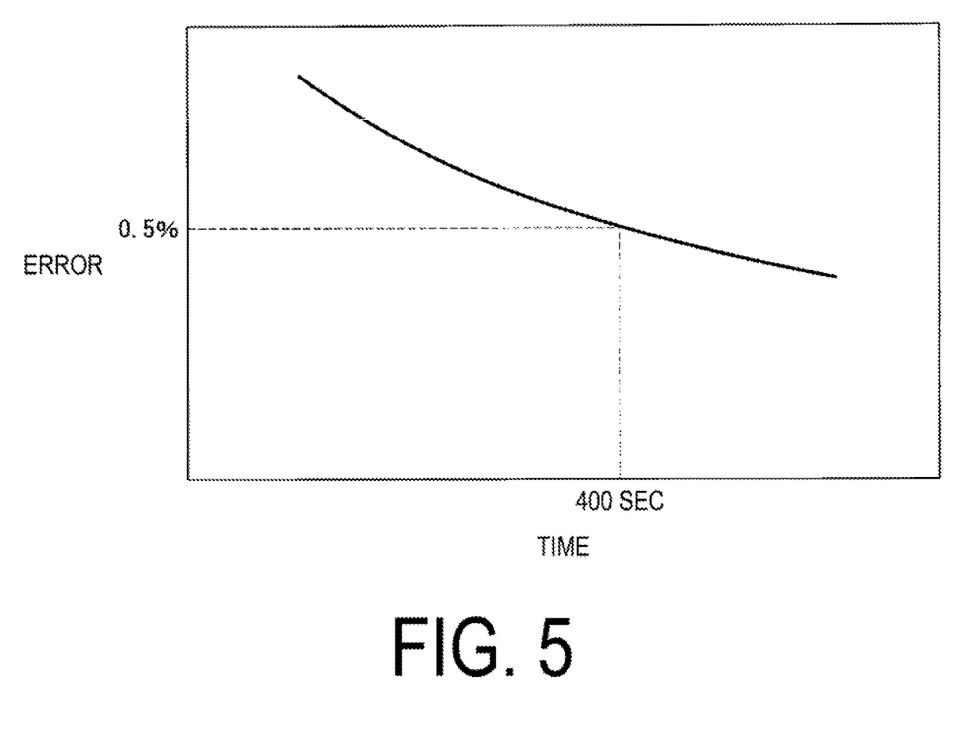
FIG. 5 is a graph illustrating an example of a relationship between a constant-current charging period and an error in the secondary battery management system according to an embodiment of the present disclosure.

The charging control unit 22 performs the constant-current charging in the constant-current charging period that is set in advance in accordance with the reference state of charge. The constant-current charging period is a predetermined period of time during which the constant-current charging is performed, and is denoted by $\Delta T$ (end time point t2−start time point t1) in FIG. 3. The constant-current charging period is a period (degradation estimation period) during which the estimating unit 23 (described later) estimates the degradation degree in the present state. To accurately estimate the degradation degree, the constant-current charging period needs to be appropriately set. During the constant-current charging period, the state of charge of the secondary battery 2 is measured at a predetermined sampling period. Thus, an excessively short constant-current charging period relative to the sampling period might result in a large measurement error. FIG. 5 is a graph illustrating an example of the relationship between the constant-current charging period and an error of the measurement target in a case where the sampling period is one second. For example, the sampling period of one second may result in the maximum sampling error of ±1 second, that is, two seconds. Considering this, to control the error amount of the measured state of charge to be within 0.5%, the constant-current charging period needs to be 400 seconds or more (dividing two seconds by 0.5%).

On the other hand, a long constant-current charging period may cause the state of charge of the secondary battery 2 to reach the temporary target state of charge before the degradation degree is estimated. Thus, it is appropriate to set to the constant-current charging period to be within about 5 to 10 minutes. Specifically, the constant-current charging period is set based on the sampling period related to the measurement of the state of charge of the secondary battery 2, to make the measurement error smaller than the upper limit value set in advance. The constant-current charging period can be set to be the shortest possible period, by setting the measurement error to be the upper limit value set in advance based on the sampling period.

After the constant-current charging period has elapsed, the charging control unit 22 still performs the constant-current charging, and performs the charging until the target state of charge calculated by the calculating unit 24 described below is achieved. After the constant-current charging period has elapsed, the constant-current charging may not be performed until the target state of charge is achieved. For example, when there is not much charging time until the discharge start time for the operation of the secondary battery system 1, the time required until the charging is completed may be shortened through quickly charging by increasing the current amount after the constant-current charging period has elapsed.

The estimating unit 23 estimates the degradation degree of the secondary battery 2 in the present state based on the amount of change in the state of charge of the secondary battery 2 changed during the predetermined constant-current charging period (set in advance based on FIG. 5 for example) with the predetermined constant current value (set in advance based on FIG. 4 for example) of the secondary battery 2. Specifically, the estimating unit 23 estimates the degradation degree of the secondary battery 2 in the present state, based on a ratio between a state of charge change rate in the present state that is an amount of change in the state of charge of the secondary battery 2 changed during the constant-current charging period and an initial state of charge change rate of the secondary battery 2 in the initial state. Here, the initial state of charge change rate is an amount of change in the state of charge of the secondary battery 2 changed during the predetermined constant-current charging period, which is checked with the secondary battery 2 in the initial state (in a start of usage state, before the secondary battery degrades). The initial state of charge change rate can be checked during test operation adjustment for example.

When the secondary battery 2 degrades, the state of charge change rate changes. Specifically, a larger degradation of the secondary battery 2 tends to lead to an increase in the amount of change in the state of charge of the secondary battery 2 changed during the constant-current charging period. For example, the storage capacity of the secondary battery 2 decreases as degradation progresses. Thus, when a charging/discharging time of a secondary battery 2 with reduced storage capacity and that of a secondary battery 2 with no reduced storage capacity are compared with the same current value, the secondary battery 2 with the reduced storage capacity reaches the set state of charge earlier and thus ends the discharging earlier. Thus, the degradation degree of the secondary battery 2 can be evaluated based on the state of charge change rate in the present state.

In view of this, using the following Formula (1), the estimating unit 23 calculates a state of charge change rate Dd in the present state, which is the amount of change ΔSOC in the state of charge of the secondary battery 2 in the present state changed during the constant-current charging period Δt.

[Math. 1]

$$Dd = \frac{\Delta SOC}{\Delta t} \quad (1)$$

The initial state of charge change rate of the secondary battery 2 in the initial state is set to the estimating unit 23 in advance. The initial state is a start of usage state in which the secondary battery 2 has not degraded. The initial state of charge change rate is, for example, assumed to be measured during manufacturing, testing, or the like of the secondary battery 2 and set. Specifically, an initial state of charge change rate Ddi is calculated using the following Formula (2) and set in advance.

[Math. 2]

$$Ddi = \frac{\Delta SOCi}{\Delta t} \quad (2)$$

In the formula, ΔSOCi represents an amount of change in the initial state of charge of the secondary battery 2 in the initial state.

Then, the estimating unit 23 estimates the degradation degree of the secondary battery 2 based on the state of charge change rate Dd in the present state and the initial state of charge change rate Ddi. Specifically, the following Formula (3) is used for calculating a degradation degree Dp.

[Math. 3]

$$Dp = \frac{Dd}{Ddi} \quad (3)$$

With a ratio of the state of charge change rate Dd in the present state to the initial state of charge change rate Ddi calculated as in Formula (3), a change in the state of charge change rate relative to the initial state can be quantitatively expressed as the degradation degree. The state of charge change rate increases as the secondary battery 2 degrades. Specifically, a value equal to or larger than 1 is obtained for the degradation degree in Formula (3), when the degradation is occurring. When there is no degradation, the initial state of charge change rate Ddi is equal to the state of charge change rate Dd in the present state, and thus the degradation degree Dp=1 holds.

The estimating unit 23 estimates the degradation degree of the secondary battery 2 in this manner and outputs the estimated degradation degree to the calculating unit 24. The calculation method for the degradation degree is not limited to the one described above, and any method may be applied as long as the degradation degree can be quantitatively evaluated.

The calculating unit 24 corrects the temporary target state of charge based on the degradation degree, and calculates the target state of charge of the secondary battery 2. In other words, the calculating unit 24 calculates the target state of charge in which the degradation of the secondary battery 2 is taken into consideration. Specifically, the calculating unit 24 corrects the temporary target state of charge SOCtemp by multiplying the temporary target state of charge by the degradation degree, as in the following Formula (4), and calculates the final target state of charge SOCt of the secondary battery 2.

[Math. 4]

$$SOC_t = SOC_{temp} \times Dp \quad (4)$$

When degradation has progressed, the degradation degree Dp in the present state is a value that is equal to or larger than 1. In other words, when degradation has progressed, the relationship SOCt>SOCtemp holds. Thus, even when the capacity of the secondary battery 2 is lower due to such degradation, the required target power amount can be more reliably stored in the secondary battery 2 by setting the target state of charge SOCt to a value larger than the temporary state of charge SOCtemp.

As illustrated in FIG. 3, when the constant-current charging period Δt ends, the calculating unit 24 calculates the target state of charge SOCt, and the constant-current charging or charging with a varying current value is performed until the target state of charge SOCt is achieved.

The calculating unit 24 issues a warning notification when the target state of charge SOCt is outside a state of charge allowable range set in advance. The state of charge allowable range is an operation range in which the upper limit and the lower limit of the state of charge are set in advance while taking the degradation and safety of the secondary battery 2 into consideration. The state of charge allowable range has an operation state of charge upper limit value (SOC 90% for example) and an operation state of charge lower limit value (SOC 10% for example) set in advance in accordance with characteristics of charging/discharging of the secondary battery 2, or the like. For example, the secondary battery 2 in a state beyond the state of charge allowable range is overcharged or overdischarged, and is in a state involving excessively quick degradation of the secondary battery 2, which may result in a failure to guarantee the safety of the secondary battery 2, or the like. Thus, the calculating unit 24 determines whether the calculated target state of charge SOCt is within the state of charge allowable range, and issues the warning notification when the target state of charge SOCt is outside the state of charge allowable range. For example, the warning notification is issued to an operator in a power plant, a factory, or the like to which the secondary battery system 1 is applied. When the target state of charge SOCt is outside the state of charge allowable range set in advance due to a temporary operation status of the secondary battery system 1, the operator or the like may determine to temporarily set the target state of charge SOCt to the operation upper limit value or the operation lower limit value for the calculating unit 24, so as to be capable of accommodating an unplanned temporary operation status in the secondary battery system 1.

Figure 6:
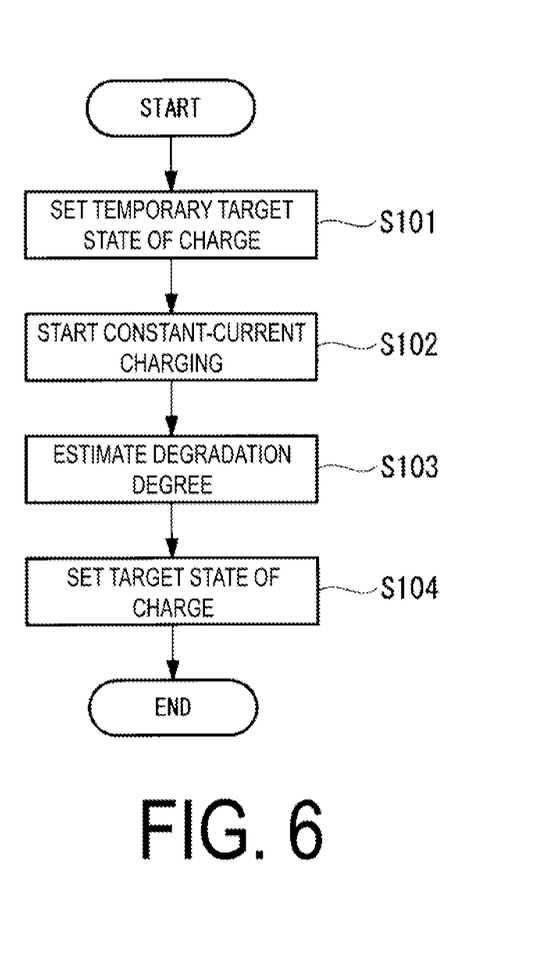
FIG. 6 is a flowchart illustrating target state of charge calculation processing executed by the secondary battery management system according to an embodiment of the present disclosure.

Next, target state of charge calculation processing executed by the secondary battery management system 4 described above will be described with reference to FIG. 6. A flow illustrated in FIG. 6 is executed when the secondary battery 2 starts to be charged. The charging of the secondary battery 2 may start in response to a start instruction from the operator or the like or may start at a time point set in advance. For example, when the secondary battery system 1 is applied to a power plant, a time point (for example, midnight), at which the fluctuation of power in the power grid 5 linked with the power plant is expected to be low and at which extra power is available to be stored in the secondary battery 2, is set in advance. For example, when the secondary battery system 1 is applied to a factory, the execution is performed at night for achieving the power consumption peak cut in the operation plan for the next day.

First, the temporary target state of charge of the secondary battery 2 is set based on the target power amount supplied from the secondary battery system 1 (S101).

Next, the predetermined constant-current charging of the secondary battery 2 starts from the predetermined reference state of charge (S102).

Next, based on the amount of change in the state of charge of the secondary battery 2 changed during the predetermined constant-current charging period, the degradation degree of the secondary battery 2 in the present state is estimated (S103).

Next, the temporary target state of charge is corrected based on the degradation degree, and the final target state of charge of the secondary battery 2 is set (S104).

Figure 7:
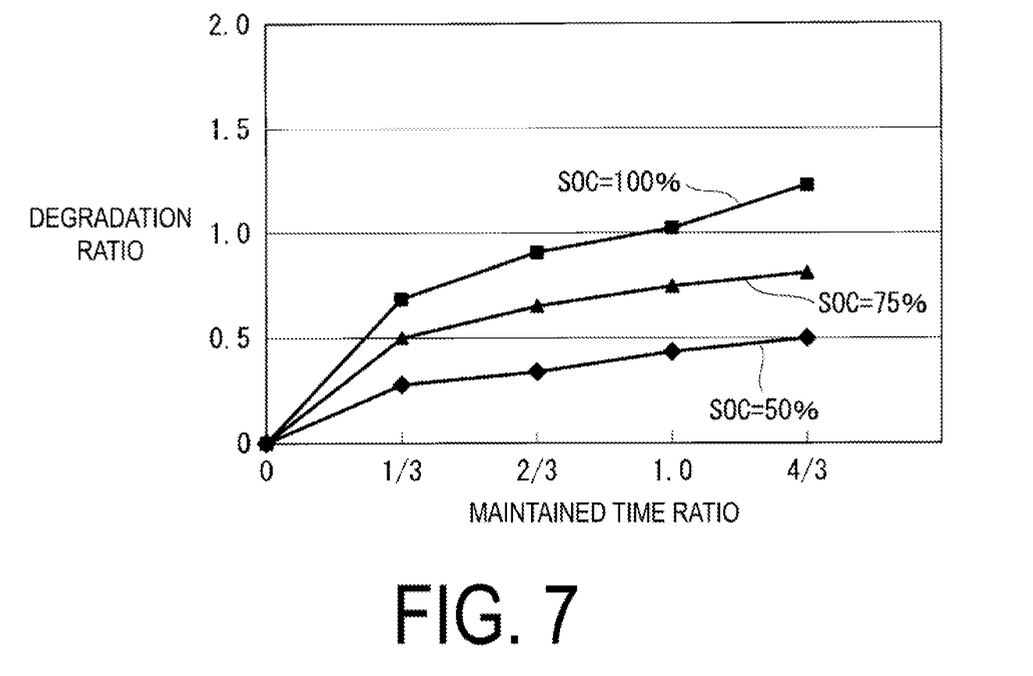
FIG. 7 is a diagram illustrating an example of a relationship between a degradation ratio and a maintained period of the secondary battery.

The secondary battery 2 is likely to degrade when maintained at a high charge state for a long period of time. FIG. 7 illustrates the relationship between the degradation ratio and the maintained period of the secondary battery 2 for each state of charge (SOC). As illustrated in FIG. 7, a longer maintained period of the secondary battery 2 in the high charge state results in a higher degradation ratio. FIG. 7 illustrates an example of a change in the degradation rate with the state of charge SOC being a parameter, based on the maintained time and the degradation rate measured with the state of charge SOC=100%. Thus, suppression of the degradation of the secondary battery 2 can be facilitated with the secondary battery 2 maintained in a state with a lowest possible state of charge while guaranteeing the storage of the required target power amount, without making the state of charge excessively high. In view of this, in the secondary battery system 1, the target state of charge of the secondary battery 2 can be set by taking the degradation into consideration, to thereby prevent the secondary battery 2 from being maintained in the excessively high charge state. As a result, the progression of the degradation of the secondary battery 2 can be suppressed.

As described above, with the secondary battery management system, the secondary battery management method and the secondary battery management program of the secondary battery management system, and the secondary battery system according to the present embodiment, the degradation degree of the secondary battery 2 in the present state is estimated based on the amount of change in the state of charge of the secondary battery 2 during the constant-current charging period. Thus, the degradation degree of the secondary battery 2 can be more accurately estimated. The temporary target state of charge set based on the target power amount is corrected in accordance with the degradation degree to determine the target state of charge of the secondary battery 2. Thus, the target power amount can be more reliably stored in the secondary battery 2, by taking the shortage of the capacity due to the degradation in the present state into consideration.

The target state of charge of the secondary battery 2 can be appropriately set by taking the degradation degree into consideration, and thus the secondary battery 2 is prevented from being maintained at an excessively high charge state, whereby the reduction of battery life can be suppressed.

The degradation degree in the present state is estimated based on a ratio between the state of charge change rate of the secondary battery 2 in the present state and the initial state of charge change rate, and thus the degradation degree can be easily estimated. Here, the initial state of charge change rate of the secondary battery 2 is an amount of change in the state of charge of the secondary battery 2 changed during the predetermined constant-current charging period, with the secondary battery 2 being in the initial state (state before the degradation).

An excessively short constant-current charging period for estimating the degradation degree relative to the sampling period related to the measurement of the state of charge might lead to a large measurement error. Thus, with the constant-current charging period set based on the sampling period, the constant-current charging period can be set with the measurement error being smaller than an upper limit value set in advance, whereby the degradation degree of the secondary battery 2 can be more accurately estimated.

When the secondary battery 2 is charged using a target state of charge outside the state of charge allowable range, safe operation may not be possible. Thus, the warning notification is issued for improving safety.

The state of charge of the secondary battery 2 at which the constant-current charging starts is uniformly set, so that the constant-current charging starts when the state of charge reaches the reference state of charge. Thus, the charging start condition can be managed for performing the constant-current charging under the same condition of the state of the secondary battery 2. Thus, an appropriate state of the secondary battery 2 in the constant-current charging period for estimating the degradation degree in the present state can be achieved, and the degradation degree can be more accurately estimated.

The present disclosure is not limited to the embodiments described above, and various modifications within the scope of the disclosure can be made.

For example, the secondary battery system 1 can be used for thermal power plants for suppressing sharp power fluctuations, and can be used for a factories and power consumption regions to implement peak cut and ancheri services (buying and selling power from/to a power company).

The secondary battery system 1 is applicable to various facilities requiring the secondary battery 2 to be installed, and is not limited to power plants and factories.

REFERENCE SIGNS LIST

1 Secondary battery system
2 Secondary battery
3 Charging/discharging device
4 Secondary battery management system
5 Power grid
6 Power-consuming facility
21 Setting unit
22 Charging control unit
23 Estimating unit
24 Calculating unit

The invention claimed is:

1. A secondary battery management system comprising:
a setting unit configured to set a temporary target state of charge of a secondary battery based on a target power amount;
an estimating unit configured to estimate a degradation degree of the secondary battery based on an amount of change in a state of charge of the secondary battery over a predetermined constant-current charging period of the secondary battery that is a predetermined period of time during which constant-current charging of the secondary battery is performed; and
a calculating unit configured to calculate a target state of charge of the secondary battery to be charged by correcting the temporary target state of charge in accordance with the degradation degree,
wherein after elapse of the constant-current charging period, the secondary battery is charged until the target state of charge calculated by the calculating unit is achieved.

2. The secondary battery management system according to claim 1, wherein the estimating unit estimates the degradation degree of the secondary battery based on a ratio between a state of charge change rate that is an amount of change in a state of charge of the secondary battery in a present state over the constant-current charging period and an initial state of charge change rate of a change in the secondary battery in an initial state over the constant-current charging period.

3. The secondary battery management system according to claim 2, wherein the constant-current charging period is set based on a sampling period related to measurement of the state of charge of the secondary battery, such that a measurement error is smaller than an upper limit value set in advance.

4. The secondary battery management system according to claim 2, wherein the calculating unit issues a warning notification when the target state of charge is outside a state of charge allowable range set in advance.

5. The secondary battery management system according to claim 2, further comprising a charging control unit configured to start constant-current charging of the secondary battery when the state of charge of the secondary battery reaches a reference state of charge.

6. A secondary battery system comprising:
a secondary battery;
a charging/discharging device configured to control a charging/discharging amount of current flowing through the secondary battery; and
the secondary battery management system described in claim 2.

7. The secondary battery management system according to claim 1, wherein the constant-current charging period is set based on a sampling period related to measurement of the state of charge of the secondary battery, such that a measurement error is smaller than an upper limit value set in advance.

8. The secondary battery management system according to claim 7, wherein the calculating unit issues a warning notification when the target state of charge is outside a state of charge allowable range set in advance.

9. The secondary battery management system according to claim 7, further comprising a charging control unit configured to start constant-current charging of the secondary battery when the state of charge of the secondary battery reaches a reference state of charge.

10. A secondary battery system comprising:
a secondary battery;
a charging/discharging device configured to control a charging/discharging amount of current flowing through the secondary battery; and
the secondary battery management system described in claim 7.

11. The secondary battery management system according to claim 1, wherein the calculating unit issues a warning notification when the target state of charge is outside a state of charge allowable range set in advance.

12. The secondary battery management system according to claim 11, further comprising a charging control unit configured to start constant-current charging of the secondary battery when the state of charge of the secondary battery reaches a reference state of charge.

13. A secondary battery system comprising:
a secondary battery;
a charging/discharging device configured to control a charging/discharging amount of current flowing through the secondary battery; and
the secondary battery management system described in claim 11.

14. The secondary battery management system according to claim 1, further comprising a charging control unit configured to start constant-current charging of the secondary battery when the state of charge of the secondary battery reaches a reference state of charge.

15. A secondary battery system comprising:
a secondary battery;
a charging/discharging device configured to control a charging/discharging amount of current flowing through the secondary battery; and
the secondary battery management system described in claim 14.

16. A secondary battery system comprising:
a secondary battery;
a charging/discharging device configured to control a charging/discharging amount of current flowing through the secondary battery; and
the secondary battery management system described in claim 1.

17. A secondary battery management method comprising:
setting a temporary target state of charge of a secondary battery based on a target power amount;
estimating a degradation degree of the secondary battery based on an amount of change in a state of charge of the secondary battery over a predetermined constant-current charging period of the secondary battery that is a predetermined period of time during which constant-current charging of the secondary battery is performed; and calculating a target state of charge of the secondary battery to be charged by correcting the temporary target state of charge in accordance with the degradation degree, wherein after elapse of the constant-current charging period, the secondary battery is charged until the target state of charge calculated by the calculating unit is achieved.

18. A non-transitory tangible computer-readable storage medium storing a secondary battery management program for causing a computer to execute:

setting processing of setting a temporary target state of charge of a secondary battery based on a target power amount;

estimation processing of estimating a degree of the secondary battery based on an amount of change in a state of charge of the secondary battery over a predetermined constant-current charging period of the secondary battery that is a predetermined period of time during which constant-current charging of the secondary battery is performed; and calculation processing of calculating a target state of charge of the secondary battery to be charged by correcting the temporary target state of charge in accordance with degradation of the degradation degree wherein after elapse of the constant-current charging period, the secondary battery is charged until the target state of charge calculated by the calculating unit is achieved.

* * * * *